(12) United States Patent
Collins, III

(10) Patent No.: US 8,583,049 B2
(45) Date of Patent: Nov. 12, 2013

(54) SELF-OPTIMIZING INTEGRATED RF CONVERTER

(75) Inventor: Thomas E. Collins, III, Tyngsboro, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 341 days.

(21) Appl. No.: 12/555,376

(22) Filed: Sep. 8, 2009

(65) Prior Publication Data

US 2011/0059709 A1    Mar. 10, 2011

(51) Int. Cl.
*H04B 7/00* (2006.01)
*H04B 17/00* (2006.01)
*H04B 1/10* (2006.01)

(52) U.S. Cl.
USPC .................. 455/67.11; 455/67.14; 455/226.1; 455/296; 455/317

(58) Field of Classification Search
USPC .................. 455/67.11, 67.13–67.7, 701–702, 455/226.1–226.4, 267, 296, 313–326
See application file for complete search history.

(56) References Cited

U.S. PATENT DOCUMENTS

| | | | |
|---|---|---|---|
| 3,922,617 A | 11/1975 | Denniston et al. | |
| 4,258,341 A | 3/1981 | Snyder | |
| 4,389,618 A | 6/1983 | Bauman | |
| 5,051,704 A | 9/1991 | Chapman et al. | |
| 5,065,110 A | 11/1991 | Ludvik et al. | |
| 5,077,532 A | 12/1991 | Obermann et al. | |
| 5,117,197 A | 5/1992 | Hsu et al. | |
| 5,959,500 A | 9/1999 | Garrido | |
| 6,009,317 A * | 12/1999 | Wynn | 455/296 |
| 6,590,451 B2 | 7/2003 | McRory | |
| 6,895,229 B2 * | 5/2005 | Schetelig et al. | 455/226.1 |
| 7,130,589 B2 * | 10/2006 | Lee et al. | 455/67.11 |
| 7,146,146 B2 * | 12/2006 | Masenten et al. | 455/296 |
| 7,203,472 B2 * | 4/2007 | Seppinen et al. | 455/226.1 |
| 7,254,379 B2 * | 8/2007 | Xu et al. | 455/296 |
| 7,327,992 B2 * | 2/2008 | Earls et al. | 455/148 |
| 7,428,683 B2 | 9/2008 | Dai et al. | |
| 7,477,881 B2 * | 1/2009 | Kim | 455/130 |
| 7,542,812 B2 | 6/2009 | Stroili et al. | |
| 7,561,862 B2 * | 7/2009 | Woo-nyun | 455/226.1 |
| 7,580,680 B2 * | 8/2009 | Isaac et al. | 455/67.11 |
| 7,715,836 B2 * | 5/2010 | Vassiliou et al. | 455/423 |

(Continued)

OTHER PUBLICATIONS

Search Report and Written Opinion of PCT/US2010/049025, mailed Nov. 5, 2010, 9 pages.

(Continued)

*Primary Examiner* — Simon Nguyen
(74) *Attorney, Agent, or Firm* — Finch & Maloney PLLC; Neil F. Maloney; Daniel J. Long

(57) ABSTRACT

Techniques are disclosed for optimization of RF converters. The techniques can be employed, for instance, in RF converters implemented in semiconductor materials (system-on-chip, or chip set) or with discrete components on a printed circuit board. In any such cases, the RF converter system can be configured with one or more actuators to adjust performance, one or more sensor to assess the performance (e.g., linearity of RF converter) and parameters of interest (e.g., ambient temperature, and a control block for controlling the sensors and actuators. The configuration allows the RF converter to autonomously self-optimize for linearity or other parameters of interest such as gain, noise figure, and dynamic range, across a broad range of variables.

15 Claims, 6 Drawing Sheets

(56) References Cited

U.S. PATENT DOCUMENTS

| | | | |
|---|---|---|---|
| 7,742,747 B2* | 6/2010 | Manku et al. | 455/114.1 |
| 7,782,928 B2* | 8/2010 | Kang et al. | 375/221 |
| 7,783,273 B2* | 8/2010 | Maeda et al. | 455/285 |
| 7,856,050 B1* | 12/2010 | Wiss et al. | 375/224 |
| 7,894,788 B2* | 2/2011 | Keehr et al. | 455/296 |
| 7,996,003 B2* | 8/2011 | Maeda et al. | 455/423 |
| 8,306,157 B2* | 11/2012 | Seendripu et al. | 375/332 |
| 2003/0124999 A1* | 7/2003 | Parssinen et al. | 455/226.1 |
| 2004/0137870 A1* | 7/2004 | Kivekas et al. | 455/326 |
| 2005/0070236 A1* | 3/2005 | Paulus | 455/135 |
| 2006/0068739 A1* | 3/2006 | Maeda et al. | 455/295 |
| 2006/0073803 A1* | 4/2006 | Igarashi et al. | 455/296 |
| 2006/0160510 A1 | 7/2006 | Seppinen et al. | |
| 2007/0097271 A1* | 5/2007 | Gao et al. | 348/724 |
| 2007/0159162 A1* | 7/2007 | Kang et al. | 324/158.1 |
| 2007/0213022 A1* | 9/2007 | Darabi | 455/232.1 |
| 2008/0080597 A1 | 4/2008 | Rofougaran | |
| 2009/0075612 A1* | 3/2009 | Keehr et al. | 455/226.1 |
| 2009/0186587 A1* | 7/2009 | Sobchak et al. | 455/196.1 |
| 2009/0247102 A1* | 10/2009 | Hsieh et al. | 455/226.1 |
| 2010/0318865 A1* | 12/2010 | Kim et al. | 714/733 |

OTHER PUBLICATIONS

Related U.S. Appl. No. 12/492,682, filed Jun. 26, 2009.

Cavers, "Adaptation Behavior of a Feedfoward Amplifier Linearizer", IEEE Transactions on Vehicular Technology, vol. 44, No. 1, Feb. 1995.

Hilborn et al., "An Adaptive Direct Conversion Transmitter", IEEE Transactions on Vehicular Technology, vol. 43, No. 2, May 1994.

Kenington et al., "Linear Distortion Correction Using a Feedfoward System", IEEE Transactions on Vehicular Technology, vol. 45, No. 1, Feb. 1996.

Kumar et al., "A Memory Controlled Feedforward Linearizer Suitable for MMIC Implementation", Communications Research Group, Dept, of Electrical Engineering, University of Saskatchewan.

Narahashi et al., "Extremely Low-Distortion Multi-Carrier Amplifier—Self-Adjusting Feed-Forward (SAFF) Amplifier", NTT Radio Communication Systems Laboratories.

Stapleton et al., "Simulation and Analysis of an Adaptive Predistorter Utilizing a Complex Spectral Convolution", IEEE Transactions on Vehicular Technology, vol. 41, No. 4, Nov. 1992.

Wilson, "The Tetra System and Its Requirements for Linear Amplification", 1994 The Institution of Electrical Engineers.

Bennet et al., Feedforward—an alternative approach to amplifier linearization, The Radio and Electronic Engineer, May 1974, pp. 257-262, vol. 44, No. 5.

Black, Inventing the negative feedback amplifier, IEEE spectrum, Dec. 1977, pp. 55-60.

Stephen James Grant, A DSP Controlled Adaptive Feedforward Amplifier Linearizer, Thesis Submitted in Partial Fulfillment of the Requirements for the Degree of Master of Applied Science, Jul. 1996, 104 pages, Simon Fraser University.

H. Seidel, A Microwave Feed-Forward Experiment, American Telephone and Telegraph Company, The Bell System Technical Journal, Nov. 1971, pp. 2879-2916, vol. 50, No. 9.

Shawn P. Stapleton, Adaptive Feedforward Linearization for RF Power Amplifiers, Agilent Technologies, Jun. 2001, 30 pages.

* cited by examiner

SELF-OPTIMIZING INTEGRATED RF CONVERTER

STATEMENT OF GOVERNMENT INTEREST

The invention claimed in this patent application was made with U.S. Government support under contract no, FA8650-09-C-7926 awarded by the Defense Advanced Research Projects Agency (DARPA). The U.S. Government has certain rights in the invention.

FIELD OF THE INVENTION

The invention relates to communications and RF receivers, and more particularly, to self-optimization of integrated RF converters.

BACKGROUND OF THE INVENTION

Dynamic range of RF converters is dependant on a number of factors. For example, the linearity is susceptible to process variation and mismatch, as well as temperature. Such factors are generally beyond the control of integrated circuit designers, once the converter is designed. If the RF converter performance is optimized for a nominal process, with perfect matching and a known temperature, any change in these factors results in a change in actual performance of the circuit that is less than optimal.

One conventional technique for achieving desired linearity is to design for yield (DFY). This design methodology essentially ensures that the RF converter design is robust against process variation and mismatch. However, DFY generally requires conservative design practice, which limits the applications for which it is appropriate. Moreover, peak performance capability of the fabrication process is avoided if it does not have reasonable yield.

Another conventional technique for achieving desired linearity is the use of non-autonomous measurement and control utilizing off-chip or otherwise external equipment, or even human interaction, in the loop. While such techniques may provide a degree of effectiveness, they require additional system resources, and tend to consume more time, especially if human interaction is involved.

There is a need, therefore, for techniques for optimization of RF converters.

SUMMARY OF THE INVENTION

One embodiment of the present invention provides a method for self-optimization of an RF converter having a mixer and an output. The method includes, in an optimization mode wherein no antenna signals are present in the RF converter, injecting a test signal into the RF converter. The method further includes with measuring the output of the RF converter to determine if linearity is satisfactory. The method further includes autonomously adjusting, with an actuator operatively coupled to the RF converter, a bias of the mixer to improve linearity. In response to linearity being unacceptable, the method continues with autonomously repeating the steps of injecting, measuring, and adjusting. In response to linearity being acceptable, the method continues with storing bias settings associated with that acceptable linearity in a memory associated with RF converter. In one particular embodiment, injecting a test signal into the RF converter includes injecting a two-tone stimulus test signal into the RF converter. In one such case, injecting a test signal into the RF converter may further include up-converting the two-tone stimulus test signal to an RF frequency of interest. In another particular case, measuring the output of the RF converter to determine if linearity is satisfactory includes determining if the magnitude of a third-order intermodulation distortion tone is within a given threshold. In another particular case, the actuator included in the RF converter is orthogonal to gain and noise figure associated with the RF converter. Thus, linearity can be adjusted without adversely impacting gain and noise figure. In response to linearity being acceptable, the method may further include enabling a normal mode of operation, thereby allowing RF signals captured by the antenna to enter RF converter. In such a case, in response to determining that a linearity check has been scheduled or requested, the method may further include re-entering the optimization mode and repeating the steps of injecting, measuring, and adjusting until an acceptable linearity is achieved. In another particular case, the optimization mode is autonomously entered. In some cases, this entry may be, for example, in response to a temperature change or a scheduled optimization.

Another embodiment of the present invention provides a system for self-optimization of an RF converter having a mixer and an output. The system includes a test signal module for, in an optimization mode wherein no antenna signals are present in the RF converter, injecting a test signal into the RF converter. The system further includes a sensor module for measuring the output of the RF converter to determine if linearity is satisfactory. The system further includes a controller for autonomously adjusting, with an actuator operatively coupled to the RF converter, a bias of the mixer to improve linearity. The system further includes a memory associated with RF converter, wherein in response to linearity being acceptable, for storing bias settings associated with that acceptable linearity. In response to linearity being unacceptable, injecting by the test signal module, measuring by the sensor module, and adjusting by the controller can be repeated. In one particular case, the test signal is a two-tone stimulus test signal. In one such case, the system may further include an up-converter block for up-converting the two-tone stimulus test signal to an RF frequency of interest. In another particular case, the sensor module is configured for determining if the magnitude of a third-order intermodulation distortion tone is within a given threshold. In another particular case, the actuator included in the RF converter is orthogonal to gain and noise figure associated with the RF converter. In another particular case, and in response to linearity being acceptable, the controller may be further configured for enabling a normal mode of operation, thereby allowing RF signals captured by the antenna to enter RF converter. In such cases, in response to determining that a linearity check has been scheduled or requested, the controller may be further configured for causing the optimization mode to be re-entered until an acceptable linearity is achieved. In another particular case, the optimization mode is autonomously entered by the system. In some such cases, this entry can be in response, for instance, to a temperature change or a scheduled optimization. In another particular case, the controller autonomously adjusts the actuator to change the bias of the mixer using an offset value associated with a parameter change having a predictable impact on linearity (e.g., if ambient temp changes from 70° to 80°, then use a given offset). In another particular case, the system is included in a system-on-chip configuration.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Techniques are disclosed for optimization of RF converters. The techniques can be employed, for instance, in RF converters implemented in semiconductor materials (system-on-chip, or chip set) or with discrete components on a printed circuit board. In any such cases, the RF converter system can be configured with actuators to adjust performance, sensors to assess the performance, and a control block for controlling the sensors and actuators. The configuration allows the RF converter to autonomously self-optimize for linearity or other parameters of interest such as gain, noise figure, and dynamic range, across a broad range of variables.

General Overview

As previously explained, linearity of RF converters is dependant on factors such as process variation and mismatch, as well as temperature. If the RF converter performance is optimized for a nominal process, with perfect matching and a known temperature, any change in these factors results sub-optimal performance. For instance, allowing the RF converter to function in a non-linear mode (e.g., saturated mixer) can result in significant communication errors or a disable receiver.

However, and in accordance with an embodiment of the present invention, sensors, actuators and control circuits can be designed into the RF converter that are capable of autonomously optimizing the RF converter circuit after fabrication and/or re-optimizing as temperature changes (or any other changes impacting RF converter performance such as linearity) occur. For instance, a sensor can be used to determine relative linearity of the RF converter, an actuator can be used to influence the linearity, and a control circuit can be used to identify and store the optimum settings for the actuators (and for a given set of conditions, if so desired). In this sense, the RF converter is configured to self-optimize for linearity and can autonomously maintain optimal linearity, thereby maximizing capacity of the RF converter.

There are a number of advantages of an RF converter capable of self-optimizing for linearity. For instance, it allows designers to obtain maximum performance from a given fabrication process and maintain acceptable yield. The self-optimization also allows designers to maintain existing performance with improved yield, and to maintain existing performance using less power. In addition, the autonomous capability allows the RF converter to be a functional drop-in replacement for existing RF converters that need to be replaced.

System Architecture

Figure 1:
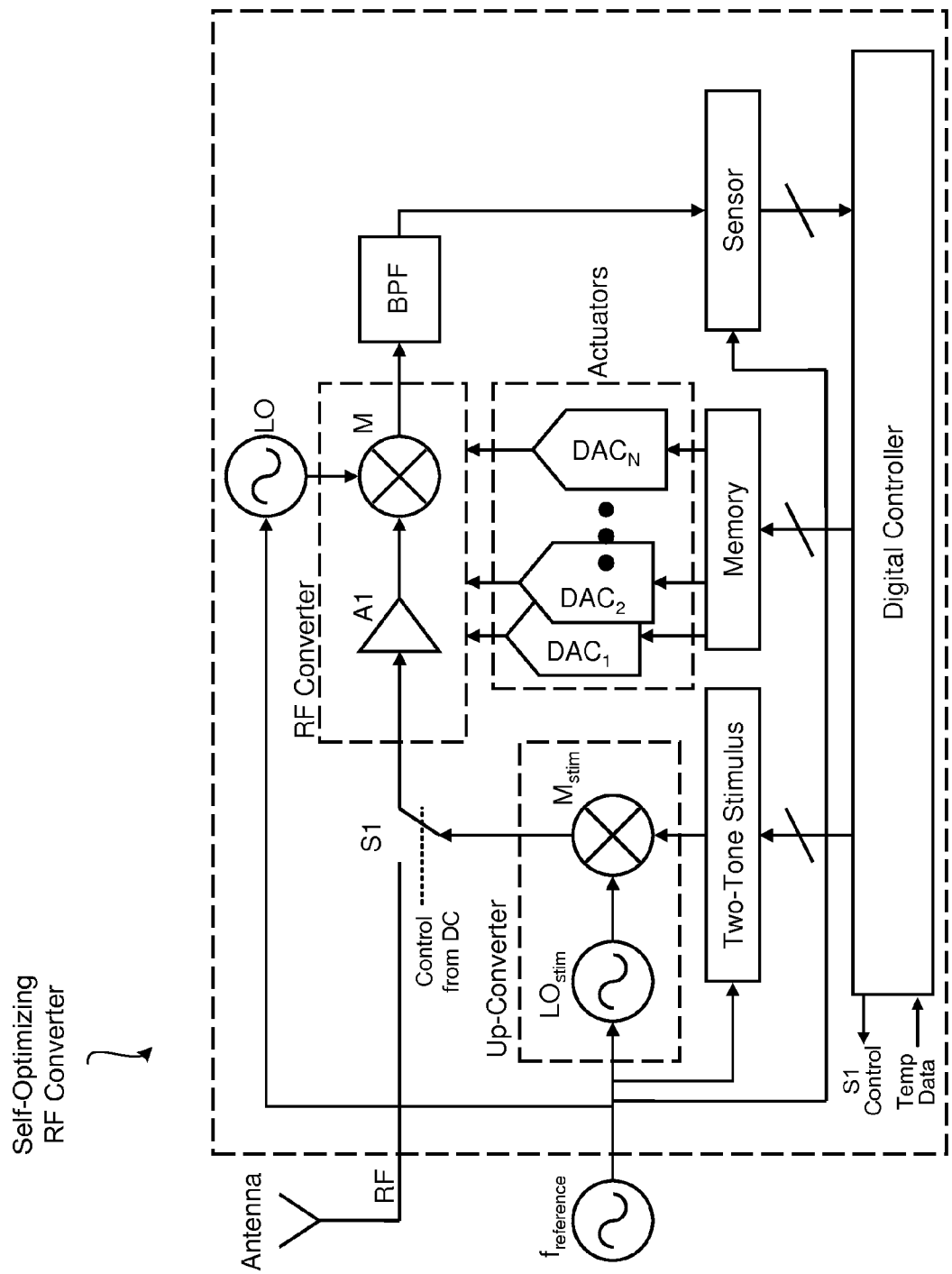
FIG. 1 is a block diagram of a self-optimizing RF converter configured in accordance with one embodiment of the present invention.

FIG. 1 is a block diagram of a self-optimizing RF converter system configured in accordance with an embodiment of the present invention. This system can be, for example, an integrated system-on-chip configuration, but other embodiments can be implemented with chip sets and/or discrete components. The system can operate in a optimization mode (closed loop mode) and a normal RF receiver mode (open loop mode). In the optimization mode, the linearity is assessed and optimized, and settings associated with that optimization are stored (e.g., in a lookup table) for use during normal mode. During normal RF receiver mode, the RF conversion process operates as typically done, but with optimal linearity as provided by virtue of the RF converter settings learned during optimization mode.

As can be seen, the system includes an RF converter block (including a gain stage A1 and a mixer M), an up-converter block (including a local oscillator $LO_{Stim}$ and a mixer $M_{Stim}$), and an actuator block (including N digital-to-analog converters, or DACs). A local oscillator LO is operatively coupled to one input of mixer M, and the output of mixer M is applied to a bandpass filter BPF. A sensor module receives the output of the bandpass filter. The system further includes a digital controller for receiving input from the sensor module, and operatively coupled to a memory and a two-tone stimulus module. The memory is operatively coupled to the actuator block, which is in turn operatively coupled to the RF converter block. The two-tone stimulus module is in turn operatively coupled to the up-converter block. A switch S1 is used to operatively couple the up-converter block to the RF converter block during the optimization mode. Otherwise, S1 is used to couple the antenna to the RF converter block during normal RF receiver mode. A source $f_{reference}$ provides a common reference to each of $LO_{Stim}$ and LO, as well as the two-tone stimulus module and the sensor module.

Note that additional componentry and a number of variations on the system can be implemented here. For instance, the output of the bandpass filter BPF can also be provided to other standard receiver circuitry (e.g., IF filtering, demodulator, detected signal amplifier, speaker and/or monitor, etc), which is not shown but will be apparent in light of this disclosure. In integrated applications (e.g. system-on-chip or chip sets), bandpass filter BPF may be on or off-chip. Similarly, local oscillators $LO_{Stim}$ and LO may be on or off-chip. Note, however, that they can still be referenced to the same source $f_{reference}$. Further note that LO and $LO_{Stim}$ share the same frequency reference, and that the stimulus and sensor modules share the same frequency reference, but all four do not need to share the same reference. Any number of on-chip component schemes can be used here, and the present invention is not intended to be limited to any particular one.

In operation, the RF converter is effectively taken off-line by using switch S1 to switch out the antenna (normal RF receiver mode) and switch in the up-converter block to perform linearity optimization (optimization mode). Switch S1 can be controlled, for example, by the digital controller or any other suitable control for commanding the mode of operation. Optimization mode can be initiated, for example, at start-up of the RF receiver, whenever a temperature change exceeding a given threshold is detected (e.g., based on one or more temperature sensors that can be on and/or off-chip), at set time intervals (e.g., based on established optimization schedule that is tailored based on empirical and/or theoretical performance data that reflects a consistent or otherwise predictable variance in linearity over time), or on-command. In the example embodiment shown in FIG. 1, a temperature data input is provided to the digital controller. This temp data can be used by the controller to initiate the optimization mode. In alternative embodiments, note that switch S1 can be eliminated if an independent means of verifying the absence of signal at the input is available (e.g., local sensor that detects signal or a control signal indicative of a quiet period).

While the RF converter system is off-line, the two-tone stimulus module injects a two-tone stimulus test signal into the RF converter by way of the up-converter block, and the BPF output is measured by the sensor module. The mixer $M_{stim}$ up-converts the two-tone stimulus test signal to the RF frequency of interest. Advantageously, the linearity of $M_{stim}$ is significantly relaxed compared to mixer M1, so long as the RF converter block has gain, the up-converter block won't need optimization itself. In one example embodiment, the sensor module is configured to monitor the magnitude of one of the third-order intermodulation distortion tones $IM3_{Upper}$ and $IM3_{Lower}$. Note however that other suitable parameters indicative of linearity quality can be assessed. With respect to this example, $IM3_{Upper}=2f_2-f_1$ and $IM3_{Lower}=2f_1-f_2$, where $f_1$ and $f_2$ are the first and second tones, respectively, of the two-tone stimulus test signal provided by the two-tone stimulus module. The result of the measurement by the sensor module is then provided to the digital controller, which makes a corresponding adjustment to the actuators in effort to achieve the desired magnitude of the IM3 tone.

Each actuator in the actuator block (in this case, DACs) can be configured with a default value (or state) which is held in the memory. During optimization mode, the digital controller changes the default state based on measurements made by the sensor module, and then re-measures the IM3 tone at the BPF output. The digital controller can iterate this process until the value of the IM3 tone is sufficiently minimized (e.g., based on an established threshold). Once a minimum or otherwise acceptable value (e.g., best effort can be considered to be sufficient, given practical limitations) of the IM3 tone has been achieved, the digital controller switches S1 back to the antenna to put the converter in normal RF receiver mode and back on-line. This switching of S1 can also effectively shut down componentry that operates only during optimization mode, such as the two-tone stimulus module, the up-converter block, and the digital controller itself. The last updated values for the DACs in the actuator block are stored in the memory (and become the new default values) until the next time the optimization mode is run. At that point, the default values may be confirmed as providing satisfactory linearity, or they may be updated as needed through the iterative process described herein. In this sense, the RF converter can self-initiate optimization mode as well as autonomously self-optimize on an established schedule and/or as commanded when changes in relevant parameters (e.g., ambient temperature) are reported.

As will be appreciated in light of this disclosure, there may be cases wherein the DACs (or other suitable actuator) are expected to change in a predictable manner based on a parameter change having a predictable impact on linearity, such as a change in RF frequency or temperature. In such cases, the result of the optimization routine may be an offset to the current default value, based on the predictable change. For instance, when a receiver is tuned to a new frequency, the DAC can be autonomously changed (by the controller) as predicted based on empirical and/or theoretical analysis. For example, a control word applied to a DAC/actuator can be changed from 0101 to 0110 (an offset of 0001) when temp changes by 10°. Thus, in some instances, the optimization routine may use known offsets when adjusting the actuators to achieve optimization, particularly after system changes having predictable results on linearization occur (e.g., temp changes, frequency changes, etc).

As will further be appreciated in light of this disclosure, optimization does not necessarily require or otherwise mean that the RF converter was sufficiently linearized. Rather, in some cases, although best efforts where made, the linearization may or may not be sufficient according to a given standard or threshold. Thus, for purposes of this disclosure, an RF converter is considered sufficiently linearized or "acceptable" when: an objective linearization standard or threshold has been met, or when best efforts have been made and the linearization is as good as it can be given limitations at hand.

The actuators in the actuator block of this example embodiment are implemented as digital-to-analog converters (DACs). Each DAC has a default value/state based on simulation or prior measurements. As previously explained, this default state can be stored in the memory, which can be updated by the digital controller. In one specific embodiment, the DACs are designed to be orthogonal to gain and noise figure. For instance, a change in the DAC output value will change the linearity of the RF converter, but have a negligible impact on the RF converter gain and noise figure. In other embodiments, such as those where the gain and noise figure are not orthogonal to linearity, the sensor module can monitor the fundamental to reset gain, and the noise floor to allow adjustments to noise (e.g., using $R_{deg}$ in FIG. 2a). Thus, note that RF converter performance parameters other than linearity can be optimized as well, such as gain, noise figure and/or dynamic range.

Figure 2A:
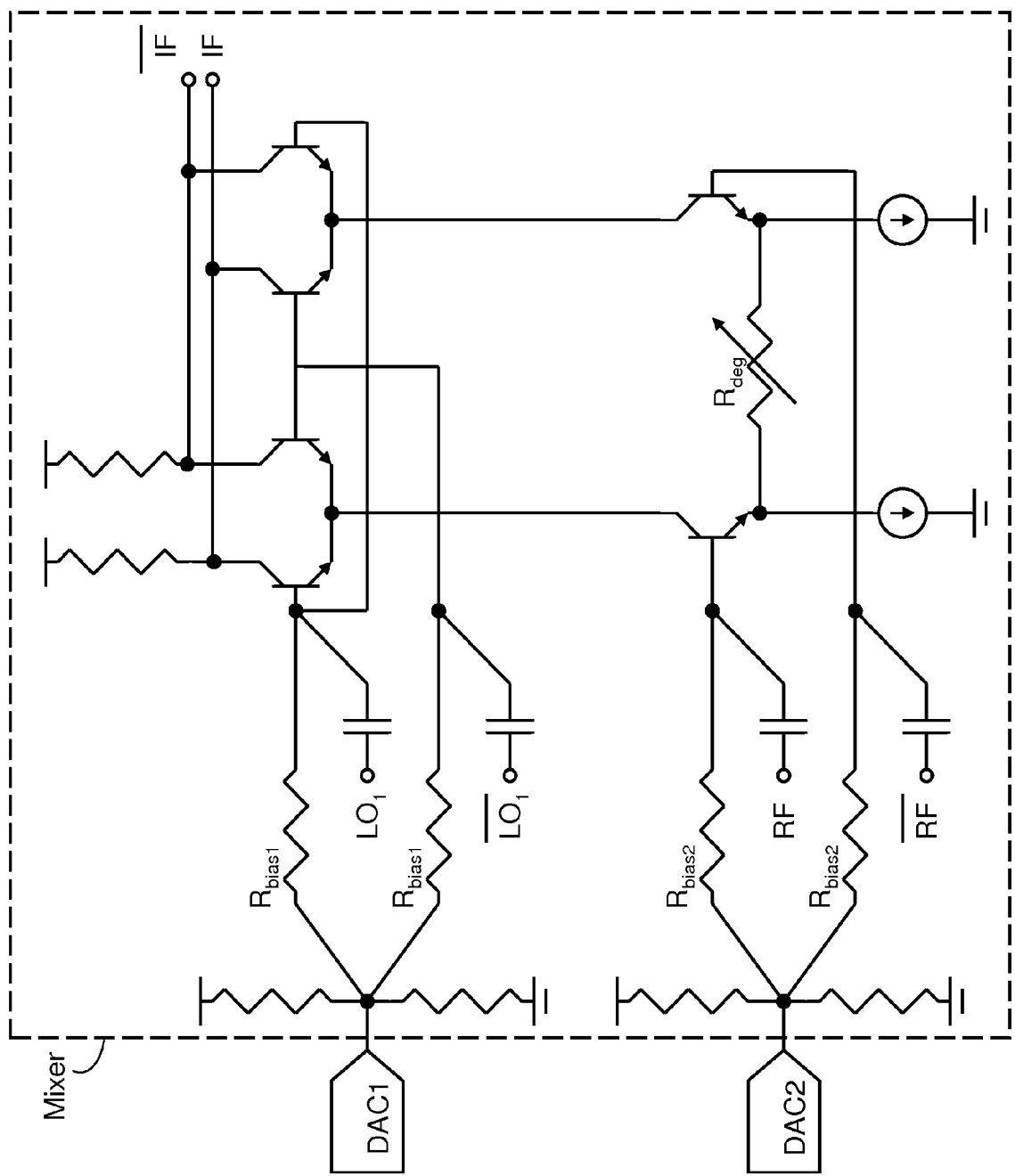
FIG. 2a illustrates actuators operatively coupled to a mixer, configured in accordance with one embodiment of the present invention.

FIG. 2a illustrates two such DACs, along with the mixer M1. The mixer M1 in this particular example is a Gilbert cell-based active mixer. Note, however, that any suitable mixer configuration can be used, depending on factors such as performance demands of the given application, as well as cost and packaging constraints. As can be seen, the mixer is configured to receive (at one mixer input) the RF input (and its complement) from the antenna, and (at the other mixer input) the local oscillator LO (and its complement), and to generate the intermediate frequency IF (and its complement). As is known, improved linearity can be achieved by increasing the degeneration impedance, $R_{deg}$. However, this can reduce the gain and increases the noise figure. In one example embodiment, a third DAC can be used to control the value of $R_{deg}$, if so desired. Other suitable adjustments mechanisms can be used as well.

In one specific embodiment, the mixer M1 is implemented as described in U.S. patent application Ser. No. 12/492,682, filed Jun. 26, 2009, and entitled, "Transimpedance Amplifier Input Stage Mixer", which is hereby incorporated in its entirety by reference. As described therein, a Gilbert cell mixer design is disclosed that, instead of using a differential transconductance stage as typically done, the design employs a differential transimpedance amplifier input stage. By utilizing a transimpedance input stage to the Gilbert mixer, feedback is used to obtain higher linearity without sacrificing noise performance. The transimpedance input stage supplies a current signal to the cascode connected Gilbert switching quad, so the transimpedance amplifier output is taken from the collector of the transimpedance amplifier output transistor, instead of the emitter as normally done with transimpedance amplifiers.

Figure 2B:
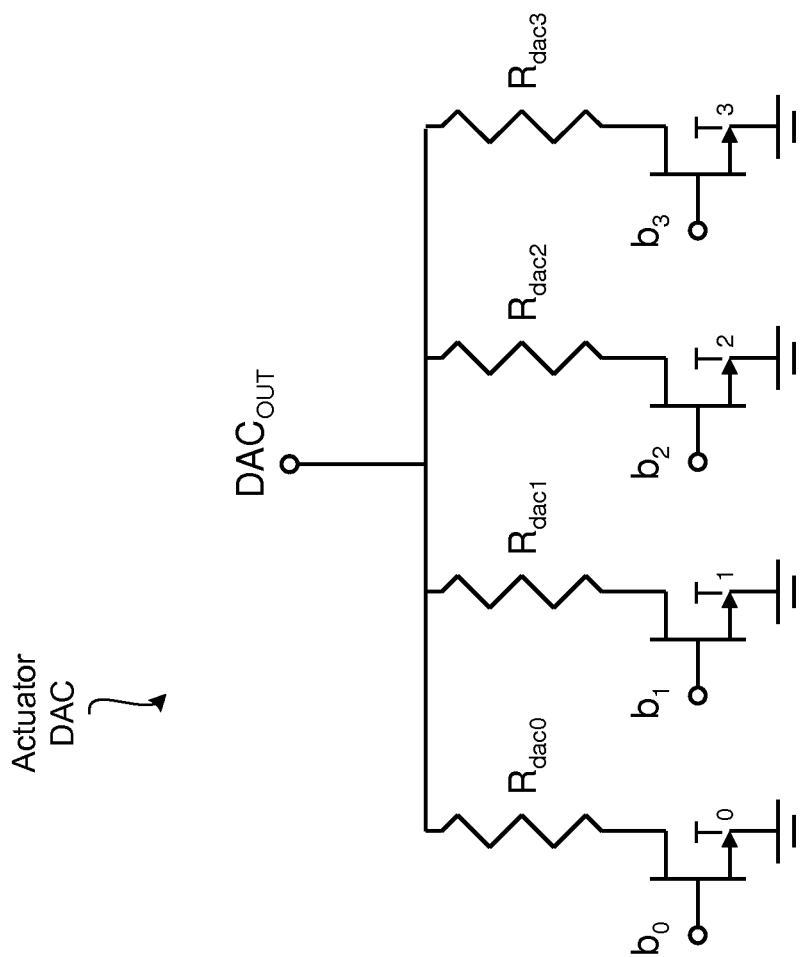
FIG. 2b illustrates an example actuator, configured in accordance with one embodiment of the present invention.

FIG. 2b illustrates an example DAC circuit. As can be seen, the DAC in this example embodiment can be controlled with a 4-bit control word (bits $b_0$ to $b_3$), which can be provided from an entry in the memory in response to direction by the digital controller. For instance, the digital controller can provide a desired linearity factor (e.g., IM3 tone value) to the memory, wherein the memory is implemented as a lookup table indexed by linearity factors that outputs a corresponding control word designed to cause the DAC to provide a bias that will decrease the magnitude of the linearity factor to an acceptable level (or at least move the magnitude toward that acceptable level). The transistors $T_0$ to $T_3$ are shown as CMOS FETs, but can be implemented with any suitable transistor or switching technology. The resistors $R_{dac0}$ to $R_{dac3}$ can be selected to provide a binary weighted resistance network that can be selectively switched to ground by operation of transistors $T_0$ to $T_3$ in response a control word to provide one of fifteen bias resistances, thereby changing the bias at $DAC_{out}$.

Measurements performed by the sensor module can be performed in analog or digital domain by, for example, selectively mixing the IM3 tone (or other target optimization parameter) to DC and integrating over some fixed time. The integration provides immunity to the noise figure of the mixer M1. In one example embodiment, this measurement can be accomplished by adding an analog down-converter with IQ outputs to the baseband and integrating in the analog realm. While the measurement of the BPF output may be taken by down-converting and accumulating either digitally or analog, any number of suitable measurement techniques can be used here, and the present invention is not intended to be limited to any particular one.

In another particular embodiment, the sensor module is implemented as described in U.S. Pat. No. 7,428,683, which is hereby incorporated in its entirety by reference. Briefly, provided therein is a built-in-self test scheme for analog circuitry functionality tests such as frequency response, gain, cut-off frequency, signal-to-noise ratio, and linearity measurement. The scheme utilizes a built-in direct digital synthesizer (DDS) as a test pattern generator that can generate various test waveforms such as chirp, ramp, step frequency, two-tone frequencies, sweep frequencies, phase modulation, amplitude modulation, and other hybrid modulations. The scheme utilizes a multiplier followed by an accumulator as an output response analyzer. The multiplier extracts the spectrum information at the desired frequency without using Fast Fourier Transform (FFT) and the accumulator picks up the DC component by averaging the multiplier output.

The two-tone stimulus module may be configured to create two-tone stimulus test signals, for example, either digitally (e.g., using direct digital synthesis, or DDS) or analog (e.g., combining phase lock loops). Any number of conventional signal synthesis techniques can be employed. The two-tone stimulus test signal provided by the two-tone stimulus module may have some distortion present, and the mixer $M_{stim}$ may add to that distortion. As previously explained, however, with some gain in the RF converter block (which is typical for active converters), the up-converter block does not need to achieve the same linearity as the RF converter being optimized (otherwise the up-converter block, would have to be optimized). In the embodiment shown in FIG. 1, gain stage A1 can be used to provide the RF converter block with positive gain for this purpose. Note, however, that the gain may occur before or after the mixing takes place in other embodiments. Further note that the up-converter block does not need to have the same instantaneous dynamic range as the RF converter being optimized.

Figure 3:
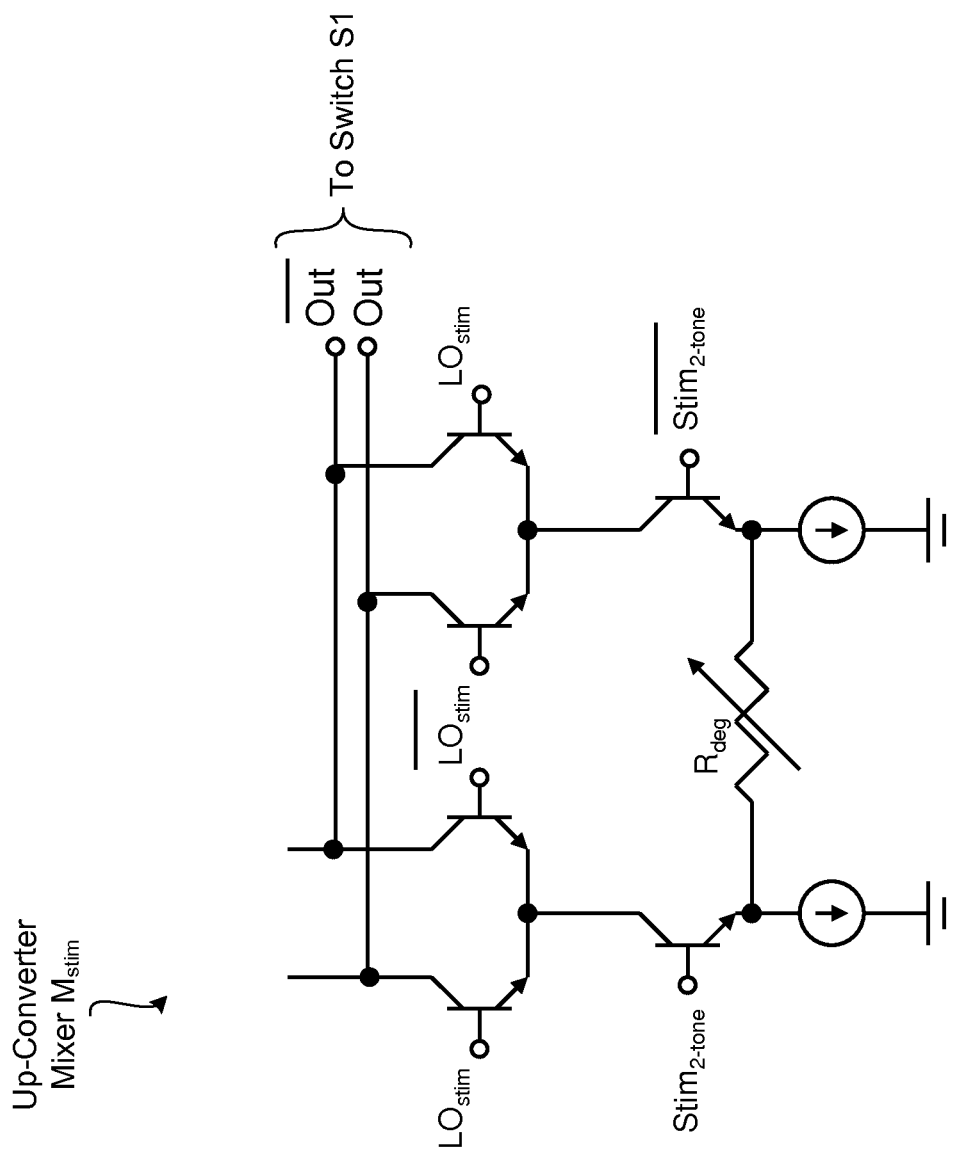
FIG. 3 illustrates an example up-converter mixer, configured in accordance with one embodiment of the present invention.

FIG. 3 illustrates an example mixer $M_{stim}$ of the up-converter block configured in accordance with an example embodiment of the present invention. The mixer $M_{stim}$ in this particular example is a Gilbert cell-based active mixer. Note, however, that any suitable mixer configuration can be used, depending on factors such as performance demands of the given application, as well as cost and packaging constraints. As can be seen, the mixer $M_{stim}$ is configured to receive (at one mixer input) the two-tone stimulus test signal $Stim_{2\text{-}tone}$ (and its complement) from the two-tone stimulus module, and (at the other mixer input) the local oscillator $LO_{stim}$ (and its complement), and to generate the RF signal (and its complement) that can be applied to the RF converter during optimization.

The dynamic range (spur free dynamic range, or SFDR) is a combination of linearity (e.g., input third order intercept point, or IIP3) and noise (e.g., noise figure). An RF converter is typically rated by its instantaneous dynamic range, but the measurements that go into SFDR (such as IIP3 and noise figure) can be made independently. Thus, in one specific embodiment, the up-converter block can be switchable between a low-noise mode where the degeneration resistor $R_{deg}$ of mixer $M_{stim}$ is set to a low value (or bypassed altogether) for noise figure measurements, and a high-linearity mode where the degeneration resistor $R_{deg}$ is set to a relatively high value for linearity measurements. Providing this flexibility regarding $R_{deg}$ can be used to further relax the design constraints on the up-converter block.

Phase noise of the local oscillator $LO_{stim}$ is potentially again relatively unimportant constraint. On the other hand, local oscillator LO may have phase noise limitations driven by the system requirements. However, the phase noise of $LO_{stim}$ can be considered if it causes the fundamental tones to raise the noise floor at the IM3 tone (or other target linearity factor) that is being measured. In one example embodiment, the spacing of the two test tones (and therefore the spacing between the fundamental tones and the IM3 tones) is configurable. This control over the spacing can be provided, for example, based on input from the digital controller. In any such case, a relatively large tone spacing can be used to compensate for the phase noise $LO_{stim}$, if so desired.

Figure 4:
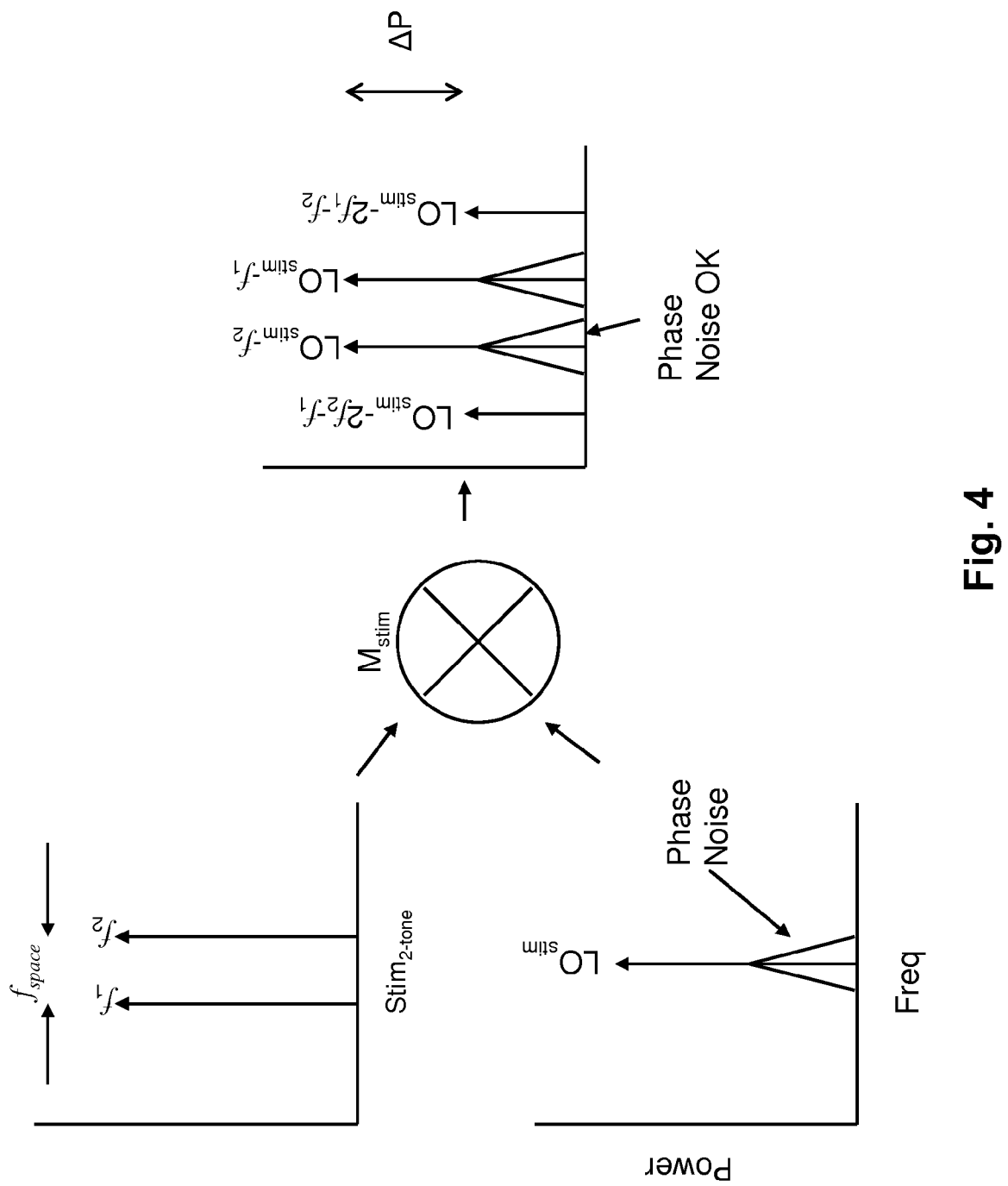
FIG. 4 demonstrates how phase noise associated with the local oscillator of the up-converter can be mitigated with spacing of the tones making up the two-tone stimulus test signal, in accordance with one embodiment of the present invention.

FIG. 4 demonstrates how phase noise associated with the local oscillator $LO_{stim}$ can be mitigated with spacing of the tones making up the two-tone stimulus test signal $Stim_{2\text{-}tone}$, in accordance with one embodiment of the present invention. As previously explained, the mixer $M_{stim}$ receives $LO_{stim}$ and $Stim_{2\text{-}tone}$. As can be seen, $Stim_{2\text{-}tone}$ includes two tone, $f_1$ and $f_2$, which are spaced apart by a distance of $f_{space}$. In addition, note that $LO_{stim}$ is associated with a degree of phase noise. As can be further seen, the spectrum output by the mixer $M_{stim}$ includes four tones: mixer $LO_{stim}$-$2f_2$-$f_1$, $LO_{stim}$-$f_2$, $LO_{stim}$-$f_1$, and $LO_{stim}$-$2f_1$-$f_2$. In this example, note that the tone spacing of $f_{space}$ effectively compensated for the phase noise $LO_{stim}$.

The digital controller is programmed or otherwise configured to issue commands to switch S1, to place the converter on-line (normal RF receiver mode) and off-line (optimization mode). In addition, the digital controller is configured to issue commands to the two-tone stimulus module (e.g., to set tone values and spacing, and any other tone parameters of interest). In addition, the digital controller is configured to receive measurements from the sensor module, and to issue commands to the memory to retrieve or otherwise cause desired actuator settings to be applied to the actuator block. The actuator setting can be, for example, represented as a 4-bit control word, as previously discussed with reference to FIG. 2b. Recall that the purpose of the actuator setting is to minimize the IM3 tone (or other target linearity factor) by adjusting the actuators block (e.g., DACs) accordingly. In one embodiment, this iterative process is implemented as a gradient descent. There may be more than one actuator to control, in which case the gradient descent may operate over multiple dimensions. After minimizing the IM3 tone, the digital controller can further be configured to use the two-tone stimulus and sensor modules to check the gain and noise factor to ensure that both remained stable during the optimization. The digital controller can be any suitable processor or controller, whether commercial or purpose-built to carryout the functionality described herein.

Methodology

Figure 5:
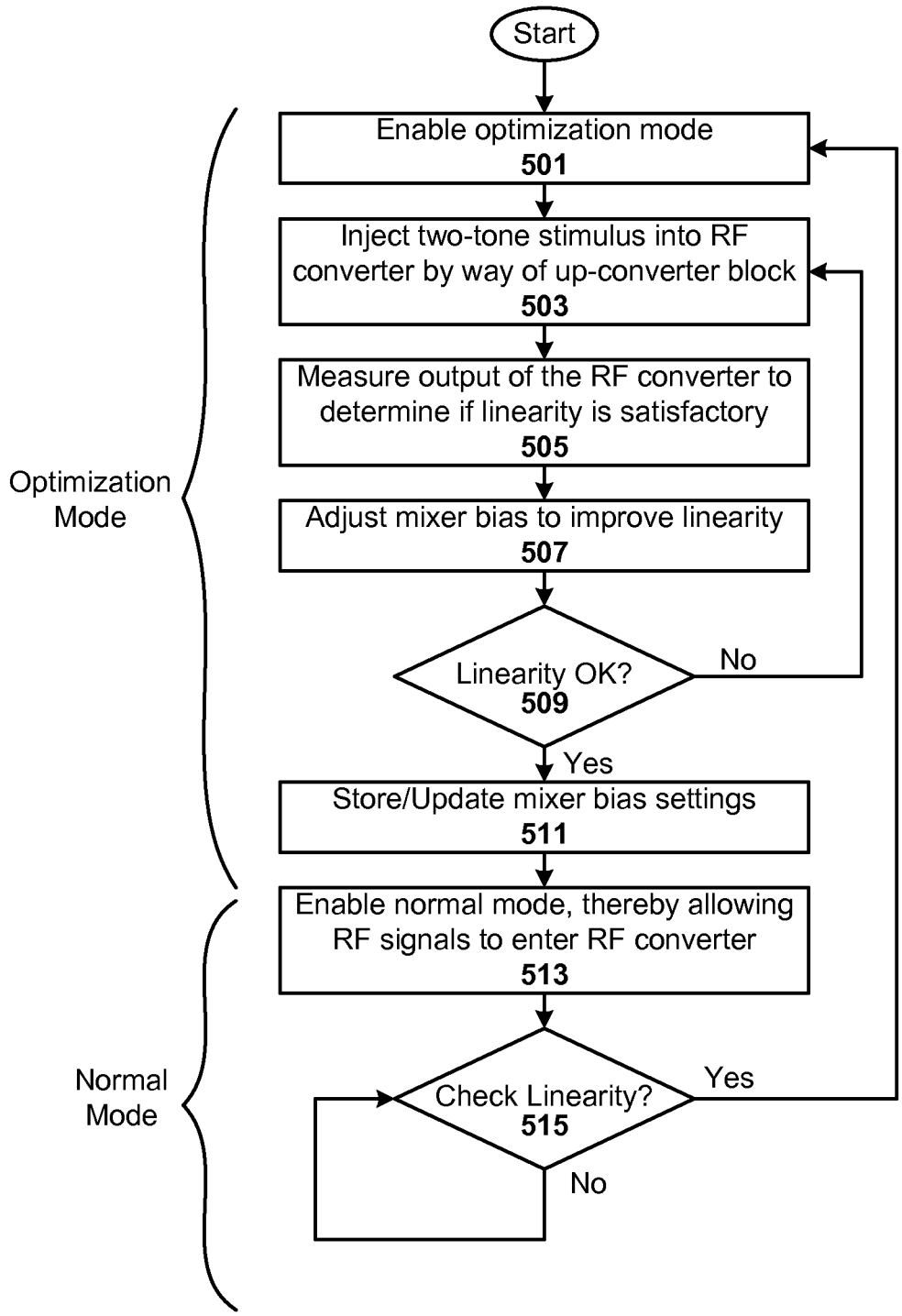
FIG. 5 illustrates a method for self-optimization of an RF converter, in accordance with one embodiment of the present invention.

FIG. 5 illustrates a method for self-optimization of an RF converter, in accordance with one embodiment of the present invention. The method can be implemented, for instance, by an SoC, such as an integrated RF converter or a RF receiver on a chip. The method includes an optimization mode and a normal RF receiver mode (generally referred to as normal mode).

The method begins with enabling 501 the optimization mode, wherein the receiver antenna is, for example, disconnected (e.g., by operation of switch S1) or otherwise disabled (e.g., configuring antenna to quiet state). This may further entail enabling a closed feedback loop that is used during optimization mode only, and the closed feedback loop is opened or otherwise disabled when in normal mode. As will be appreciated in light of this disclosure, the closed feedback loop allows test signals to be applied to the RF converter so the corresponding RF converter output can be monitored while optimization adjustments are made.

With no RF antenna signal coming into the RF converter, the method continues with injecting 503 a test signal (e.g., two-tone stimulus test signal) into the RF converter. Depending on the target frequency range of the test signal, it may be provided by way of an up-converter block (such as shown in FIG. 1), to up-convert the test signal to the RF frequency of interest.

The method continues with measuring 505 the output of the RF converter to determine if linearity (or some other target parameter) is satisfactory. As previously explained, a sensor module or any suitable output response analyzer (ORA) placed in the feedback loop (such as shown in FIG. 1) can be configured to monitor parameters indicative of linearity quality. In one example embodiment, the magnitude of a third-order intermodulation distortion tone ($IM3_{Upper}$ or $IM3_{Lower}$) can be measured. In some embodiments, note that the measured value can then be provided to a controller for further processing and/or directing, if necessary.

The method continues with autonomously adjusting 507 the mixer bias to improve linearity (or other target parameter). As previously explained, the RF converter can be configured with self-optimization componentry, including actuators that are designed to be orthogonal to gain and noise figure, as discussed with reference to FIGS. 1 and 2a-b. For instance, a change in the DAC output value (based on change in control word applied to that DAC) will change the linearity of the RF converter, but have a negligible impact on the RF converter gain and noise figure. Likewise, an adjustment to gain and/or noise figure can have negligible impact on linearity. Other adjustment schemes and mechanisms to effect desired changes in RF converter linearity (or other parameter of interest) without adversely impacting other parameters will be apparent in light of this disclosure.

The method continues with determining 509 if the linearity (or other target parameter) is acceptable. This determination can be based on, for example, by comparing a measured parameter value (such as the one measured in step 505) with an established threshold that is known to correlate to an acceptable level. If the measured value exceeds or otherwise does not meet the threshold, then it can be assumed that linearity (or other target parameter) is not yet optimal or otherwise acceptable and the optimization process can continue accordingly as shown in FIG. 5 (where steps 503 through 509 are repeated until a desired degree of linearity is achieved).

Otherwise, if the measured value is determined to be within the threshold or otherwise acceptable, the method continues with storing 511 (or updating) the mixer bias default settings in a memory. As previously explained, these default settings can be used to configure the state or output value of an actuator that adjusts the mixer bias to effect desired changes in linearity.

Once the linearity is determined to be acceptable and the corresponding bias settings are stored, the method continues with enabling 513 the normal mode, thereby allowing RF signals captured by the antenna to enter RF converter. This may entail switching the antenna back in circuit, and disconnecting or otherwise opening the feedback loop used during the optimization mode. As previously explained, the embodiment shown in FIG. 1 uses a control signal generated by the digital controller to control switch S1 to switch between modes of operation.

Once in normal mode, the RF converter can operate as typically done until a linearity check is scheduled or otherwise requested (or other target parameter check). Thus, the method continues with determining 515 if a linearity check (or other target parameter check) has been scheduled or requested. For instance, linearity checks may be scheduled periodically (e.g., every hour or once a day at midnight during off-business hours). The frequency of the optimization schedule will depend on the demands of the given application. Such parameter checks may also be manually requested, for example, by a user pressing or otherwise activating the optimization mode. In addition, a sensor such as a temperature sensor that is configured to monitor the ambient temperature local to the RF converter deployment site, can be used to report temperature values (or other parameter data of interest) to the digital controller or other suitable control entity. If the temperature transitions beyond a given transition threshold (e.g., a temperature change of more than 5 degrees since last optimization), then the controller can detect same and command optimization mode to be entered.

The foregoing description of the embodiments of the invention has been presented for the purposes of illustration and description. It is not intended to be exhaustive or to limit the invention to the precise form disclosed. Many modifications and variations are possible in light of this disclosure. For instance, although the method of FIG. 5 focuses on the parameter of linearity, other embodiments may focus on other parameters of interests, such as gain, noise figure, and/or dynamic range. It is intended that the scope of the invention be limited not by this detailed description, but rather by the claims appended hereto.

What is claimed is:

1. An on-chip method for self-optimization of an RF converter having a mixer and an output, comprising:

in an autonomous self-optimization mode of the RF converter wherein no antenna signals are present in the RF converter, injecting a test signal into an on-chip up-converter which in-turn injects an up-converted test signal into the RF converter, wherein the up-converted test signal is in-band, and wherein dynamic range of the up-converter is relaxed compared to dynamic range of the RF converter and the up-converter is switchable between a low-noise mode where a degeneration impedance associated with up-conversion mixer is set to a to value or bypassed for noise figure measurements, and a high-linearity mode where the degeneration impedance is set to a relatively higher value for linearity measurements;

in the self-optimization mode, autonomously measuring, with an on-chip sensor, the output of the RF converter to determine if linearity of the RF converter is satisfactory, using selective spectrum analysis, wherein measuring the output of the RF converter to determine if linearity is satisfactory includes determining if the magnitude of a third-order or higher intermodulation distortion tone is within a given threshold;

in the self-optimization mode, autonomously adjusting, with an on-chip actuator operatively coupled to the RF converter, a bias signal of the mixer to improve linearity, wherein the bias signal is in addition to signals to be mixed by the mixer;

in response to linearity being unacceptable, autonomously repeating the steps of injecting, measuring, and adjusting; and in response to linearity being acceptable, storing bias settings associated with that acceptable linearity in a memory associated with the RF converter.

2. The method of claim 1 wherein injecting a test signal comprises injecting a two-tone stimulus test.

3. The method of claim 1 wherein the actuator included in the RE converter is orthogonal to gain and noise figure associated with the RF converter.

4. The method of claim 1 wherein in response to linearity being acceptable, the method further comprises:
enabling a normal mode of operation, thereby allowing RF signals captured by the antenna to enter RF converter; and
in response to determining that a linearity check has been scheduled or requested, re-entering the self-optimization mode and repeating the steps of injecting, measuring, and adjusting until an acceptable linearity is achieved.

5. The method of claim 1 wherein tone spacing of the test signal is set to compensate for phase noise of a local oscillator used in the up-converter.

6. The method of claim 1 wherein the self-optimization mode is autonomously entered in response to changes impacting RF converter performance or a scheduled optimization.

7. A system for on-chip self-optimization of an RF converter having a mixer and an output, comprising:
an on-chip test signal module for, in an autonomous self-optimization mode of the RF converter wherein no antenna signals are present in the RF converter, injecting a test signal into an on-chip up-converter which in-turn injects an up-converted test signal into the RF converter, wherein the up-converted test signal is in-band, and wherein dynamic range of the up-converter is relaxed compared to dynamic range of the RF converter the up-converter is switchable between a low-noise mode where a degeneration impedance associated with up-conversion mixer is set to a low value or bypassed for noise figure measurements, and a high-linearity mode where the degeneration impedance is set to a relatively higher value for linearity measurements;
an on-chip sensor module for, in the self-optimization mode, autonomously measuring the output of the RF converter to determine if linearity of the RF converter is satisfactory, using selective spectrum analysis, wherein the sensor module is configured for determining if the magnitude of a third-order or higher intermodulation distortion tone is within a given threshold;
an on-chip controller for, in the self-optimization mode, autonomously adjusting, with an on-chip actuator operatively coupled to the RF converter, a bias signal of the mixer to improve linearity, wherein the bias signal is in addition to signals to be mixed by the mixer; and
a memory associated with RF converter, wherein in response to linearity being acceptable, for storing bias settings associated with that acceptable linearity;
wherein in response to linearity being unacceptable, injecting by the test signal module, measuring by the sensor module, and adjusting by the controller are repeated.

8. The system of claim 7 wherein the test signal is a two-tone stimulus test signal.

9. The system of claim 7 wherein the actuator included in the RF converter is orthogonal to gain and noise figure associated with the RF converter.

10. The system of claim 7 wherein in response to linearity being acceptable, the controller is further configured for enabling a normal mode of operation, thereby allowing RF signals captured by the antenna to enter RF converter, and in response to determining that a linearity check has been scheduled or requested, the controller is further configured for causing the self-optimization mode to be re-entered until an acceptable linearity is achieved.

11. The system of claim 7 wherein tone spacing of the test signal is set to compensate for phase noise of a local oscillator used in the up-converter.

12. The system of claim 7 wherein the self-optimization mode is autonomously entered by the controller in response to changes impacting RF converter performance or a scheduled optimization.

13. The system of claim 7 wherein the controller autonomously adjusts the actuator to change, the bias of the mixer using an offset value associated with a parameter change having a predictable impact on linearity.

14. An on-chip method for self-optimization of an RF converter having a mixer and an output, comprising:
in an autonomous self-optimization mode of the RF converter wherein no antenna signals are present in the RF converter, injecting a test signal into an on-chip up-converter which in-turn injects an up-converted test signal into the RF converter, wherein the up-converted test signal is in-band, and wherein dynamic range of the up-converter is relaxed compared to dynamic range of the RF converter;
in the self-optimization mode, autonomously measuring with an on-chip sensor, the output of the RF converter to determine if linearity of the RF converter is satisfactory, using selective spectrum analysis, wherein measuring the output of the RF converter to determine if linearity is satisfactory includes determining if the magnitude of a third-order or higher intermodulation distortion tone is within a given threshold;
in the self-optimization mode, autonomously adjusting, with an on-chip actuator operatively coupled to the RF converter, a bias signal of the mixer to improve linearity, wherein the bias signal is in addition to signals to be mixed by the mixer;
in response to linearity being unacceptable, autonomously repeating the steps of injecting, measuring, and adjusting; and
in response to linearity being acceptable, storing bias settings associated with that acceptable linearity in a memory associated with the RF converter, wherein the up-converter is switchable between a low-noise mode and a high-linearity mode, and the high-linearity mode is active during the injecting, measuring, and adjusting.

15. A system for on-chip self-optimization of an RF converter having a mixer and an output, compromising:
- an on-chip test signal module for, in an autonomous self-optimization mode of the RF converter wherein no antenna signals are present in the RF converter, injecting a test signal into an on-chip up-converter which in-turn injects an up-converted test signal into the RF converter, wherein the up-converted test signal is in-band, and wherein dynamic range of the up-converter is relaxed compared to dynamic range of the RF convert;
- an on-chip sensor module for, in the self-optimization mode, autonomously measuring the output of the RF converter to determine if linearity of the RF converter is satisfactory, using selective spectrum analysis, wherein the sensor module is configured for determining if the magnitude of a third-order or higher intermodulation distortion tone is within a given threshold;
- an on-chip controller for, in the self-optimization mode, autonomous adjusting, with an on-chip actuator operatively coupled to the RF converter, a bias signal of the mixer to improve linearity wherein the bias signal is in addition to signals to be mixed by the mixer; and
- a memory associated with RF converter, whereiner, in response to linearity being acceptable, for storing bias settings associated with that acceptable linearity;
wherein in reaponse to linearity being unacceptable, injecting by the test signal module, measuring by the sensor module, and adjusting by the controller are repeated, and wherein the up-converter is switchable between ,a low-noise mode and a high-linearity mode, and the high-linearity mode is active during the injecting, measuring, and adjusting.

\* \* \* \* \*